(12) United States Patent
McCallister et al.

(10) Patent No.: US 8,185,065 B2
(45) Date of Patent: May 22, 2012

(54) TRANSMITTING UNIT THAT REDUCES PAPR USING OUT-OF-BAND DISTORTION AND METHOD THEREFOR

(75) Inventors: Ronald Duane McCallister, Scottsdale, AZ (US); Eric M. Brombaugh, Mesa, AZ (US)

(73) Assignee: CrestCom, Inc., Scottsdale, AZ (US)

( * ) Notice: Subject to any disclaimer, the term of this patent is extended or adjusted under 35 U.S.C. 154(b) by 421 days.

(21) Appl. No.: 12/580,069

(22) Filed: Oct. 15, 2009

(65) Prior Publication Data

US 2011/0092173 A1     Apr. 21, 2011

(51) Int. Cl.
*H04B 1/16* (2006.01)
(52) U.S. Cl. ............... 455/114.2; 455/108; 375/296
(58) Field of Classification Search ............ 455/108, 455/114.1, 114.2, 114.3, 126, 127.1; 375/295, 375/296, 297, 300
See application file for complete search history.

(56) References Cited

U.S. PATENT DOCUMENTS

| | | | |
|---|---|---|---|
| 4,298,871 A | 11/1981 | Kennedy et al. | |
| 5,490,172 A | 2/1996 | Komara | |
| 5,519,530 A | 5/1996 | Utsumi | |
| 5,646,631 A | 7/1997 | Arntz | |
| 5,727,026 A * | 3/1998 | Beukema | 375/296 |
| 6,236,864 B1 | 5/2001 | McGowan et al. | |
| 6,356,606 B1 | 3/2002 | Hahm | |
| 6,366,619 B1 | 4/2002 | McCallister et al. | |
| 6,519,244 B1 | 2/2003 | Unno | |
| 6,741,661 B2 | 5/2004 | Wheatley, III et al. | |
| 6,771,940 B2 | 8/2004 | Smith | |
| 6,813,317 B2 | 11/2004 | Ishida et al. | |
| 6,845,082 B2 | 1/2005 | Bourget et al. | |
| 6,928,121 B2 | 8/2005 | MacFarlane Shearer, III et al. | |
| 6,999,522 B2 | 2/2006 | Shearer, III | |
| 6,999,733 B2 | 2/2006 | Hori et al. | |
| 7,013,161 B2 * | 3/2006 | Morris | 455/522 |
| 7,054,385 B2 * | 5/2006 | Booth et al. | 375/300 |
| 7,110,445 B2 | 9/2006 | Melsa | |
| 7,170,952 B2 | 1/2007 | Hunton | |
| 7,236,533 B2 | 6/2007 | Chu et al. | |
| 7,295,816 B2 | 11/2007 | McCallister | |
| 7,376,197 B2 | 5/2008 | Berangi et al. | |

(Continued)

OTHER PUBLICATIONS

Wang, Luqing & Tellambura, Chintha, "A Simplified Clipping and Filtering Technique for PAR Reduction in OFDM Systems", Jun. 6, 2005, , IEEE Signal Processing Letters, vol. 12, No. 6.

(Continued)

*Primary Examiner* — Blane J Jackson
(74) *Attorney, Agent, or Firm* — Meschkow & Gresham, P.L.C.

(57) ABSTRACT

A transmitting unit (12) clips a communication signal (14) to form a threshold-responsive signal (36, 36') which includes in-band distortion (40) and out-of-band distortion (38). A portion of the out-of-band distortion (38) is notched within rejection bands (48, 50) adjacent to the communication signal's bandwidth (24). But remaining portions of the out-of-band distortion (38) and portions of the in-band distortion (40) are included with the communication signal (14). The remaining portion of the out-of-band distortion (38) causes the communication signal (14) to be in violation of a spectral mask (30). The mask-violating communication signal 14 with out-of-band distortion (38) and in-band distortion (40) is amplified by an RF power amplifier (22). After amplification, a bandpass filter (92) exhibiting fast rolloff regions (110) attenuates the amplified out-of-band distortion (38) causing compliance with the spectral mask (30).

27 Claims, 4 Drawing Sheets

U.S. PATENT DOCUMENTS

| | | | |
|---|---|---|---|
| 7,463,697 B2 * | 12/2008 | Maltsev et al. | 375/297 |
| 7,574,189 B2 * | 8/2009 | Lozhkin et al. | 455/308 |
| 7,643,801 B2 * | 1/2010 | Piirainen | 455/114.2 |
| 7,664,472 B2 * | 2/2010 | Mosley, Jr. et al. | 455/91 |
| 7,756,216 B2 * | 7/2010 | Ishikawa et al. | 375/296 |
| 7,778,348 B2 * | 8/2010 | Lozhkin | 375/295 |
| 2002/0191705 A1 | 12/2002 | Melsa et al. | |
| 2003/0053562 A1 | 3/2003 | Busson et al. | |
| 2003/0086507 A1 | 5/2003 | Kim et al. | |
| 2005/0163252 A1 | 7/2005 | McCallister et al. | |
| 2007/0254592 A1 | 11/2007 | McCallister et al. | |
| 2008/0019453 A1 | 1/2008 | Zhao et al. | |

OTHER PUBLICATIONS

J. Armstrong, "New OFDM Peak-to-Average Power Reduction Scheme", Proc. IEEE VTS 53rd Vehicular Technology Conference. vol. 1, pp. 756-760, May 2001.

* cited by examiner

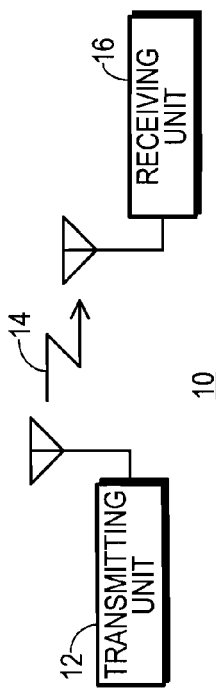
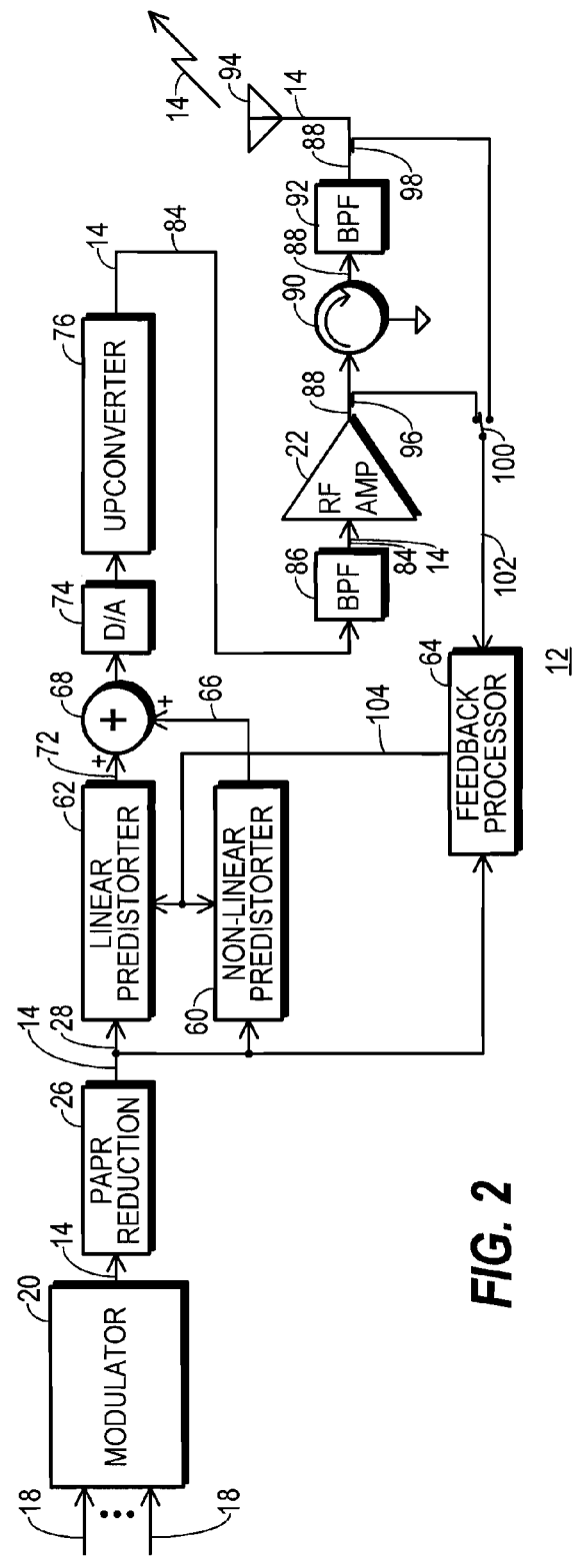

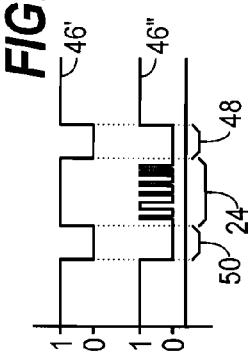
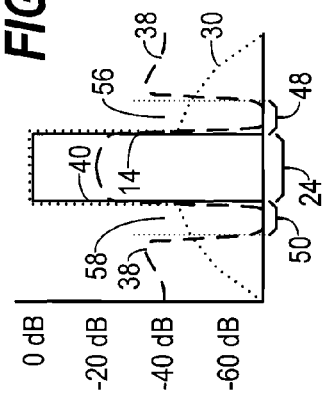
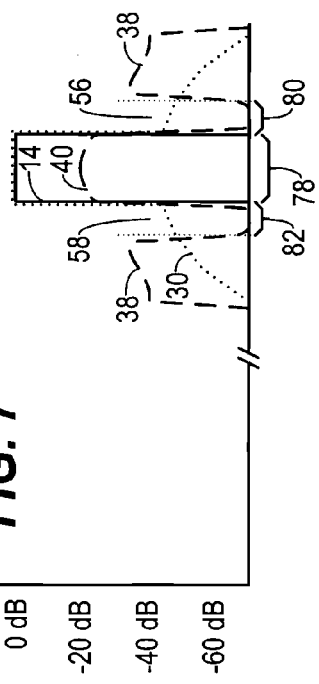
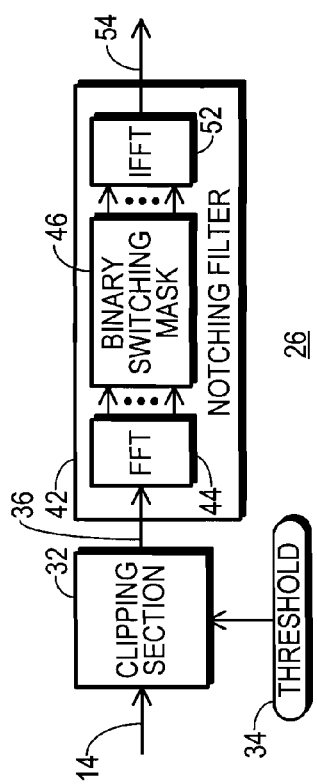
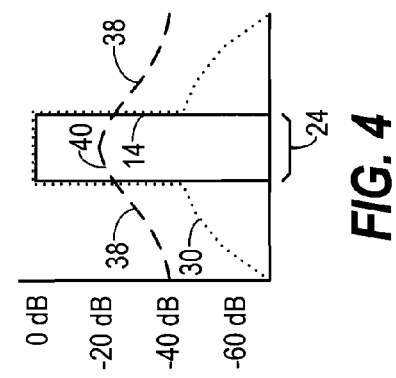

US 8,185,065 B2

TRANSMITTING UNIT THAT REDUCES PAPR USING OUT-OF-BAND DISTORTION AND METHOD THEREFOR

TECHNICAL FIELD OF THE INVENTION

The present invention relates generally to the field of communication systems. Specifically, the present invention relates to transmitting units which include circuits and/or processes for the purpose of reducing peak-to-average power ratio (PAPR). More specifically, the present invention relates to reducing PAPR through the use of out-of-band distortion.

BACKGROUND OF THE INVENTION

A peak of a communication signal represents the greatest instantaneous amplitude, magnitude, or power level exhibited by a communication signal within some period of time. An average of the communication signal represents the average amplitude, magnitude, or power level of the communication signal over that same period. The peak is greater than the average, and the ratio of the peak power to the average power (PAPR) is a parameter of interest to communication system designers.

A successful communication system should maintain an adequately high signal-to-noise ratio (SNR) in signals received at receiving units. An adequately high SNR may be achieved by transmitting a signal from a transmitting unit at a high enough average power so that it is received at a receiving unit in excess of background noise power. Peak power is of less importance for these purposes. Specifically, the average power of the signal received at the receiving unit should exceed the background noise power by at least that SNR required to achieve acceptable quality data transfer over the link. And, any noise included in the transmitted signal broadcast from the transmitting unit should be low enough so that, when received at the receiving unit with the background noise, it leads to negligible increase in the total noise.

A successful communication system also keeps component costs low and uses power efficiently. One area which has a large impact on costs and power efficiency is the radio-frequency (RF) power amplifier included in transmitting units. Many modern modulation formats use communication signal amplitude, at least in part, to convey data. This amplitude modulation makes the use of a linear RF power amplifier desirable. But linearity is achieved only so long as the instantaneous amplitude of a communication signal remains beneath some maximum level. If the communication signal's peak power exceeds this maximum level, nonlinear amplification results, causing the spectrum of the communication signal to grow and exceed regulatory limitations imposed on the transmitting unit and also causing increased noise. Accordingly, the communication signal's peak power should be kept below this maximum level. But this maximum level should also be designed to be as low as possible to keep costs down. Significant costs are typically involved in providing power amplifiers and power amplifier biasing systems which support linear operation up to high peak amplitude levels.

Moreover, most linear power amplifiers become more power efficient as the PAPR decreases. Power amplifiers that accommodate high peak amplitude but have an average level far below this peak amplitude typically consume more power than would be needed to transmit the same average power level with a lower PAPR. Since many transmitting units are battery operated, the consumption of excessive power is a particularly undesirable design feature because excessive power consumption leads to the use of undesirably large batteries and/or frequent battery recharging.

Accordingly, many communication systems benefit from some sort of PAPR reduction prior to amplification in their transmitting units. Some benefits come in the form of reduced costs and power efficiency improvements in connection with providing and operating RF power amplifiers. And, other benefits come from operating transmitting units at a greater average power, which increases link margins and permits greater amounts of data to be transmitted in a given period of time. As a general rule, a small amount of peak reduction leads to only a small amount of benefit, and greater benefit results from greater amounts of peak reduction.

But certain constraints limit the amount of peak reduction that may be achieved. One such constraint is a maximum limit on the amount of noise included in the transmitted signal broadcast from the transmitting unit. This constraint may be designated as an error vector magnitude (EVM) specification. EVM specifications are based upon achieving a desired SNR at a receiving unit for a given modulation order and coding rate. EVM may be designated as the ratio of the total amount of noise power in a communication signal to the total signal power in that signal. It is usually specified as a percentage, equal to one-hundred divided by the square-root of the SNR.

Another constraint is imposed by governmental regulations which limit the spectral emissions from a transmission unit. Such regulations may be referred to as a spectral mask. A typical spectral mask permits a maximum average in-band power level to be emitted from a transmitting unit within a specified bandwidth. But outside that bandwidth the emitted power is severely restricted. A certain amount of out-of-band power, usually far less than the maximum average in-band power, is typically permitted in the portion of the spectrum adjacent to the specified bandwidth, with further diminishing amounts of out-of-band power being permitted farther from the specified bandwidth.

These constraints have caused conventional PAPR reduction techniques to be less effective than they might have been, causing conventional communication systems to obtain less peak-reduction benefit than desired. And, as spectral mask constraints become more stringent, the conventional PAPR techniques are even less effective.

One conventional technique passes a communication signal, which otherwise includes little or no noise and meets its spectral mask constraints, through a hard limiter, clipping off that portion of the communication signal that exceeds a threshold. The clipping function causes the clipped communication signal to differ from its ideal shape, infusing in-band and out-of-band noise into the clipped communication signal. The out-of-band noise resulting from the clipping function also causes spectral regrowth in excess of the amounts permitted by its spectral mask. But spectral mask compliance is reestablished by filtering the clipped communication signal to reduce the out-of-band noise beneath the amount specified by the spectral mask. And, the clipping threshold is adjusted to be as high as it needs to be so that the clipped communication signal with the remaining in-band noise meets EVM specifications.

This clip-and-filter technique suffers from two problems. First, thresholds are usually set relatively high in order to meet EVM specifications. Consequently, only a small amount of peak-reduction and peak-reduction benefit is achieved. Second, the in-band noise introduced by the clipping function is infused into the clipped communication signal itself so that it cannot be processed separately from the communication signal. In modulation formats where multiple carriers or channels have been combined in the communication signal, different EVM specifications may apply to the different carriers or channels. But after the in-band noise has been infused into the communication signal the noise portion cannot be processed without applying the same processing to the communication signal itself. Consequently, all carriers or channels are forced to comply with the most stringent EVM specification for the different modulation formats being conveyed.

This problem of immediately infusing in-band noise into the communication signal may be addressed in an alternate technique by performing an excursion generation function, which is nearly opposite to the function performed by the hard limiter of the clip-and-filter technique. The excursion generation function substitutes zero magnitude samples for all samples in the communication signal less than the threshold, and passes all samples having a magnitude greater than or equal to threshold, but reduced in magnitude by the magnitude of the threshold. Thus, a resulting excursion signal conveys only the portion of the communication signal that exceeds the threshold. This excursion signal may then be processed to control the in-band noise being applied to different carriers or channels without disturbing the communication signal with such processing. Then, after such processing, the excursion signal is recombined with the original communication signal to cancel peak events. But the excursion generation function also introduces out-of-band noise that is filtered out to meet spectral mask requirements. So, the processed cancellation signal consists almost entirely of in-band noise. As with the clip-and-filter technique, thresholds are set higher than desired in order to meet EVM specifications. Consequently, less peak-reduction and less peak-reduction benefit are achieved than is desired.

Both of the above discussed peak reduction techniques rely almost exclusively on in-band noise to reduce peaks. Out-of-band noise is permitted in the peak reduction efforts only to the extent that it remains beneath a spectral mask. In other words, so little out-of-band energy is used for peak reduction that out-of-band energy asserts virtually no influence in the peak-reduction process.

Other techniques have been discussed which rely exclusively on out-of-band nulling waveforms or artifacts to limit peaks. The out-of-band nulling waveforms or artifacts are added to a communication signal to limit peaks, and then filtered off after amplification in an RF power amplifier. In these techniques, no clipping or excursion generation functions are performed. Consequently, in-band noise from clipping or excursion generation functions is not introduced into the communication signal and EVM does not suffer from peak-reduction efforts. Unfortunately, very little peak reduction may be achieved relying exclusively on the addition of out-of-band nulling waveforms or artifacts to a communication signal. Consequently, in spite of avoiding functions that worsen EVM, less peak-reduction and less peak-reduction benefit are achieved than is desired.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

FIG. 1 shows a block diagram of a communication system within which a transmitting unit configured in accordance with the teaching of the present invention operates;

FIG. 2 shows a block diagram of an exemplary transmitting unit configured in accordance with the teaching of the present invention;

FIG. 3 shows a block diagram of a first embodiment of a peak-to-average power ratio (PAPR) reduction section of the exemplary transmitting unit of FIG. 2;

FIG. 4 graphically shows a spectral comparison of an exemplary communication signal confined within a bandwidth, exemplary in-band and out-of-band distortion generated from the communication signal in a clipping section, and an exemplary regulatory spectral mask;

FIG. 5 graphically shows exemplary switching masks used in connection with OFDM and OFDMA applications for a notching filter portion of the PAPR reduction section of FIG. 3;

FIG. 6 graphically shows the application of a selected switching mask to the exemplary in-band and out-of-band distortion depicted in FIG. 4;

FIG. 7 graphically shows signals depicted in FIG. 6 shifted to RF frequencies;

DETAILED DESCRIPTION OF THE PREFERRED EMBODIMENTS

Figure 8:
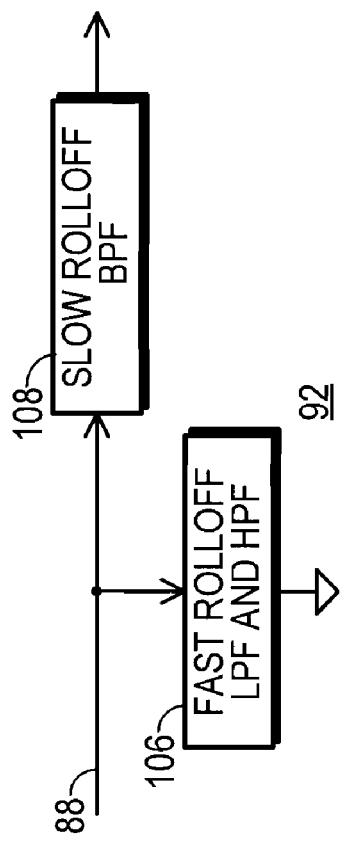
FIG. 8 shows a block diagram of an exemplary bandpass filter (BPF) used in the transmitting unit of the exemplary transmitting unit of FIG. 2.

FIG. 1 shows a block diagram of a communication system 10 within which a transmitting unit 12 configured in accordance with the teaching of the present invention operates. Transmitting unit 12 broadcasts a communication signal 14 that is successfully received and demodulated by a receiving unit 16. The device or site that implements transmitting unit 12 may also implement a receiving unit 16, and vice-versa. Within communication system 10, a single transmitting unit 12 may concurrently transmit communication signal 14 to a plurality of receiving units 16, as occurs when a base station transmits over a downlink to a number of subscriber units within its radio range. Likewise, a plurality of transmitting units 12 may concurrently transmit to a single receiving unit 16, as occurs when a number of subscriber units transmit over an uplink to a base station. The present invention is not limited to operating in accordance with any single communication standard. But, the present invention may be useful in connection with communication systems compatible with a wide variety of commonly implemented communication standards, including WiFi, WiMAX, EVDO, and LTE.

FIG. 2 shows a block diagram of an exemplary transmitting unit 12. Transmitting unit 12 receives one or more raw data streams 18 at an input of a modulator 20. Modulator 20 forms a weakly processed digital version of communication signal 14. When more than one raw data stream 18 is provided to modulator 20, each data stream is modulated, and the individual data streams may be combined together to form this version of communication signal 14. In the preferred embodiments, modulator 20 implements a form of amplitude modulation (e.g., 16-QAM, 32-QAM, 64-QAM) in forming communication signal 14, causing communication signal 14 to convey raw data, at least in part, through variations in the amplitude of communication signal 14. Such amplitude modulation is consistent with many popular communication standards, and makes the use of a linear RF power amplifier 22 (discussed below) within transmitting unit 12 desirable. Nothing prevents modulator 20 from additionally implementing a modulation form that does not include amplitude modulation (e.g., BPSK, QPSK, 8-PSK) from time to time and/or in connection with selected ones of raw data streams 18. And, modulator 20 may combine these forms of modulation with frequency-to-time domain translations to implement an OFDM and OFDMA communication standard, and/or modulator 20 may further modulate such modulation forms in accordance with a spreading or frequency-hopping code to implement a spread spectrum communication standard. Desirably, modulator 20 forms communication signal 14 so that its spectral power is confined within an allocated bandwidth 24 (FIG. 4) located at baseband. But the weakly processed version of communication signal 14 formed in modulator 20 may exhibit undesirably high peaks, causing a peak-to-average power ratio (PAPR) parameter to be undesirably high as well.

An output of modulator 20 couples to an input of a PAPR reduction section 26. PAPR reduction section 26 processes the weakly processed version of communication signal 14 from modulator 20 to reduce its PAPR. Desirably, PAPR reduction section 26 is implemented so that the form of communication signal 14 generated by PAPR reduction section 26, also called a notched signal 28, remains compatible with noise specifications (e.g., EVM specifications) imposed on transmitting unit 12. But in the preferred embodiments discussed herein, notched signal 28 intentionally violates a spectral mask 30 (FIG. 4) constraint imposed in transmitting unit 12.

FIG. 3 shows a block diagram of a first embodiment of PAPR reduction section 26 of transmitting unit 12. The weakly processed version of communication signal 14 formed by modulator 20 is applied at a clipping section 32. Clipping section 32 passes all samples exhibiting a magnitude below a threshold 34 without altering the samples, and substitutes the threshold 34 magnitude for any samples exhibiting a magnitude greater than or equal to threshold 34. Thus, clipping section 32 implements a hard limiting function. All peaks in communication signal 14 exceeding threshold 34 are clipped, but distortion outside bandwidth 24 (FIG. 4) and distortion inside bandwidth 24 are added to communication signal 14. Although not specifically shown, the sampling rate of communication signal 14 may be increased prior to the clipping operation of clipping section 32 to accommodate the spectral regrowth. In the preferred embodiment, the sampling rate is increased by a factor of four above the Nyquist rate that supports bandwidth 24. Threshold 34 may be increased to decrease the amount of PAPR reduction achieved and to decrease the noise added to communication signal 14. Or, threshold 34 may be decreased to increase PAPR reduction and also increase noise added to communication signal 14. In this embodiment of PAPR reduction section 26, clipping section 32 generates a threshold-responsive signal 36, which is a peak-reduced version of communication signal 14.

FIG. 4 graphically shows a spectral comparison. The solid line depicted in FIG. 4 indicates communication signal 14 confined within its baseband bandwidth 24, as applied to clipping section 32. The dashed line indicates out-of-band (OOB) distortion 38 and in-band (IB) distortion 40 introduced into communication signal 14 by clipping section 32. OOB distortion 38 and IB distortion 40 are distortion with respect to the goal of communicating information to receiving unit 16 (FIG. 1).

In this embodiment, OOB distortion 38 and IB distortion 40 are not actually distinguished from communication signal 14 in threshold-responsive signal 36. Rather, threshold-responsive signal 36 represents the combination of OOB distortion 38, IB distortion 40, and communication signal 14. Within bandwidth 24, the amplitude of threshold-responsive signal 36 is still almost equal to the amplitude of communication signal 14 since the power of IB distortion 40 is at a small fraction of the power of communication signal 14.

The version of communication signal 14 formed by modulator 20 (FIG. 2) may be viewed as being ideally configured for the goal of communicating information to receiving unit 16, within limitations of sampling rates and quantization. The combination of OOB distortion 38 and IB distortion 40 into communication signal 14 by clipping section 32 to form threshold-responsive signal 36 causes threshold-responsive signal 36 to be configured differently from this ideal configuration. Consequently, OOB distortion 38 and IB distortion 40 are undesirable attributes of communication signal 14 for the goal of communicating information to receiving unit 16. The combination of OOB distortion 38 and particularly IB distortion 40 into communication signal 14 to form threshold-responsive signal 36 increases EVM and also reduces PAPR, which militate against the goal of communication information to receiving unit 16. But reducing PAPR at the expense of increasing EVM somewhat is desirable for other reasons. In particular, reducing PAPR at the expense of increasing EVM allows transmitting unit 12 to operate at a higher average power level while remaining within the linear range of operation for RF power amplifier 22. Operating at a higher average power level permits a greater amount of data to be communicated to receiving unit 16 in a given period of time. And, a less expensive form of RF power amplifier 22 may be used in transmitting unit 12, and that less expensive RF power amplifier 22 may be operated more efficiently when PAPR is reduced.

Conversely, if one were to hypothetically combine a time-domain signal corresponding to OOB distortion 38 and IB distortion 40 back into threshold-responsive signal 36, OOB distortion 38 and IB distortion 40 could be canceled and an ideally configured communication signal 14, with reduced EVM but greater PAPR, could be restored. This suggests that both OOB distortion 38 and IB distortion 40 are influential in controlling EVM and reducing PAPR. If the influence of IB distortion 40 were exaggerated while the influence of OOB distortion 38 diminished, PAPR for an individual peak event may be effectively reduced but excessive EVM results. And, when multiple peak events are nearby in time, IB distortion 40 from one peak can be distributed in the time domain signal to interfere with the nearby peak events, reducing the effectiveness of peak reduction for the nearby peak event. If the influence of OOB distortion 38 were to be exaggerated while the influence of IB distortion 40 diminished, PAPR reduction for an individual peak event would be less effective, but EVM could be reduced. And, the OOB distortion 38 for one peak event in time is less influential over other peak events in time. Accordingly, as discussed in more detail below, transmitting unit 12 uses OOB distortion 38 with IB distortion 40 to effectively reduce peaks without excessively increasing EVM and to minimize the influence of peak reduction for one peak event in the time domain upon nearby peak events.

The dotted line in FIG. 4 indicates spectral mask 30. Spectral mask 30 sets forth regulatory constraints under which transmitting unit 12 operates. But in FIG. 4 spectral mask 30 has been shifted to baseband to correspond to the baseband version of communication signal 14 in PAPR reduction section 26. The 0 dB point in FIG. 4 corresponds to a full power condition for transmitting unit 12. Thus, spectral mask 30 sets forth a permitted maximum ratio of communication signal 14 within bandwidth 24 to communication signal 14 outside bandwidth 24 for the full power condition. FIG. 4 shows that threshold-responsive signal 36 violates spectral mask 30 because the ratio of in-band signal components to OOB distortion 38 exceeds the ratio permitted by spectral mask 30 when transmitting unit 12 operates at full power. As discussed below in more detail, this spectral mask violation is corrected downstream.

Referring back to FIG. 3, threshold-responsive signal 36 is applied to a notching filter 42. Notching filter 42 notches the frequency spectrum of threshold-responsive signal 36 adjacent to bandwidth 24 (FIG. 4). FIG. 3 depicts a form of notching filter 42 useful in an OFDM or OFDMA application. This form of notching filter 42 includes a fast Fourier transform (FFT) section 44 to which threshold-responsive signal 36 is applied. FFT section 44 transforms threshold-responsive signal 36 from a time-domain signal into a frequency-domain signal, with separate frequency bins for each subcarrier of the OFDM-configured or OFDMA-configured communication signal 14 within bandwidth 24, and many more bins in the portion of the spectrum where OOB distortion 38 (FIG. 4) resides. In the example where the sampling rate of threshold-responsive signal 36 is four times the Nyquist rate which supports bandwidth 24, one and a half times the number of bins included within bandwidth 24 are included above bandwidth 24 and one and a half times the number of bins included within bandwidth 24 are included below bandwidth 24. This frequency-domain version of the peak-reduced communication signal 14 is applied to a binary switching mask 46.

FIG. 5 graphically shows exemplary binary switching masks 46' and 46" respectively used in connection with OFDM and OFDMA applications for notching filter 42. Referring to FIGS. 3 and 5, binary switching masks 46' or 46" implement a dot product multiplication in each bin, with either the value of one or zero. Outside of bandwidth 24, binary switching masks 46' and 46" are identical to one another. But within bandwidth 24, where the OFDM or OFDMA subcarriers reside, masks 46' and 46" differ. For the OFDM application, where no other nearby transmitting unit 12 is likely to be transmitting in the same frequency range, binary switching mask 46' includes nothing but ones for all subcarriers within bandwidth 24. As a result of the dot product multiplication at binary switching mask 46', substantially all the power of threshold-responsive signal 36 within bandwidth 24, including IB distortion 40, passes through mask 46'.

But for the OFDMA application, where other nearby transmitting units 12 are likely to be transmitting in the same frequency range, binary switching mask 46" is configured to include ones for those subcarriers within bandwidth 24 that are allocated to transmitting unit 12, and zeros for all other subcarriers within bandwidth 24. As the assignment of subcarriers to transmitting unit 12 changes from symbol period to symbol period, the definition of binary switching mask 46" also changes. As a result of the dot product multiplication at binary switching mask 46", power is passed only in those subcarriers of bandwidth 24 specifically assigned to transmitting unit 12. This includes the power from communication signal 14 received at the input to clipping section 32 along with only a portion of IB distortion 40. Substantially no portion of IB distortion 40 is passed in subcarriers of the allocated frequency band not assigned to transmitting unit 12. Accordingly, transmitting unit 12 introduces substantially no noise into subcarriers where other transmitting units 12 may be transmitting.

Outside bandwidth 24, binary switching masks 46' and/or 46" implement upper and lower rejection bands 48 and 50, respectively. Upper rejection band 48 is spectrally located adjacent to and above bandwidth 24. Lower rejection band 50 is spectrally located adjacent to and below bandwidth 24. Binary switching mask 46 includes only zeros within rejection bands 48 and 50 and ones elsewhere. In this configuration, substantially no portion of OOB distortion 38 is passed through mask 46 in rejection bands 48 and 50. But substantially all of OOB distortion 38 outside of rejection bands 48 and 50 passes through mask 46.

A bandpass filter located at the output of RF power amplifier 22 for transmitting unit 12 will be discussed in more detail below. This bandpass filter is configured to have a passband corresponding to bandwidth 24 and rolloff regions which correspond to rejection bands 48 and 50. Outside rejection bands 48 and 50, this bandpass filter can sufficiently attenuate OOB distortion 38 to correct the spectral mask violation of threshold-responsive signal 36. Inside rejection bands 48 and 50, OOB distortion 38 is sufficiently reduced so that no spectral mask violation occurs in spite of this bandpass filter exhibiting little attenuation. The preferred width of rejection bands 48 and 50 is no wider than it needs to be to accommodate the rolloff regions of the bandpass filter at the output of RF power amplifier 22 while attenuating OOB distortion 38 to comply with spectral mask 30 (FIG. 4). But in one embodiment, rejection bands 48 and 50 may each extend across a range of frequencies up to a range equivalent to bandwidth 24. Widths of rejection bands 48 and 50 greater than a range equivalent to bandwidth 24 restrict the peak-reducing effectiveness of the small portion of OOB distortion 38 permitted to pass through mask 46.

In one alternate embodiment, mask 46 need not be implemented as a binary switching mask but can apply varying amounts of gain and/or attenuation. In this alternate embodiment the values used in mask 46 within rejection bands 48 and 50 need not remain at zero throughout the entirety of rejection bands 48 and 50. Rather, a minimum gain value (e.g., zero) may be used immediately adjacent to bandwidth 24, with increasing gain values provided as the frequency bins of rejection bands 48 and 50 extend away from bandwidth 24. In another alternate embodiment, mask 46 need not use the same maximum gain value (e.g., one) inside bandwidth 24 and outside of rejection bands 48 and 50. Rather, scaling may be applied to adjust the relative portions of OOB distortion 38 included with IB distortion 40 in communication signal 14. An example of these alternate embodiments is discussed below in connection with FIG. 11. In yet another alternate embodiment, the widths of rejection bands 48 and 50 need not be equal or static. Thus, the width of one of rejection bands 48 and 50 may shrink while the other expands in response to temperature changes to track temperature-driven changes in the performance of the bandpass filter at the output of RF power amplifier 22.

Referring back to FIG. 3, following the switching operation of binary switching mask 46, communication signal 14 is transformed back into a time domain signal through an inverse fast Fourier transform (IFFT) section 52. The form of peak-reduced communication signal 14 that emerges from IFFT section 52 may serve as the output of PAPR reduction section 26. This form of communication signal 14 is also called notched signal 28.

Notching filter 42 implements two notches in the frequency spectrum of threshold-responsive signal 36. For an OFDMA application, this notching function of notching filter 42 may be combined with a subcarrier masking operation that substantially blocks all IB distortion 40 in subcarriers assigned to other transmitting units 12. In an alternate embodiment, notching filter 42 may be implemented in the time domain using digital filtering techniques known to those skilled in the art, permitting FFT and IFFT sections 44 and 52 to be omitted.

FIG. 6 shows a frequency domain graph depicting the application of OFDM mask 46' (FIG. 5) in notching filter 42 to OOB distortion 38 and IB distortion 40. FIG. 6 resembles FIG. 4, but an upper spectral notch 56 and a lower spectral notch 58 have now been formed in the frequency spectrum of OOB distortion 38 at upper rejection band 48 and lower rejection band 50, respectively. Upper spectral notch 56 resides adjacent to and above bandwidth 24, and lower spectral notch 58 resides adjacent to and below bandwidth 24. Notched signal 28 is a time-domain signal equivalent to the combination of the notched OOB distortion 38 and IB distortion 40 (dashed line), with communication signal 14 (solid line). If OFDMA mask 46" (FIG. 5) were used in notching filter 42, spectral notches 56 and 58 and OOD distortion 38 outside of notches 56 and 58 would be substantially identical to what is shown in FIG. 6. But within bandwidth 24, IB distortion 40 and communication signal 14 each have energy peaks only in the active subcarriers, corresponding to the peaks of mask 46" shown in FIG. 5.

Referring back to FIG. 2, notched signal 28 is applied to an input of a nonlinear predistorter 60, an input of a linear predistorter 62, and an input of a feedback processor 64. Nonlinear predistorter 60 extends the range of linear operation for RF power amplifier 22. The range of linear operation is extended by intentionally distorting communication signal 14, such as the version of signal 14 provided by notched signal 28, in a way opposite to the way RF power amplifier 22 will distort communication signal 14 as it begins to enter its nonlinear range of operation. Thus, the predistortion of nonlinear predistorter 60 compensates for the nonlinear distortion of RF power amplifier 22, and the net result is a more linear amplification at signal amplitudes where amplification would otherwise be somewhat nonlinear and an extended range of linear operation for RF power amplifier 22.

In nonlinear predistorter 60, notched signal 28 is spectrally processed to introduce out-of-band predistortion in addition to OOB distortion 38 (FIG. 6) discussed above. In one embodiment, nonlinear predistorter 60 desirably generates a plurality of higher-order basis functions in response to a baseband form of communication signal 14, such as notched signal 28. The basis functions are functionally related to communication signal 14 in a nonlinear way. In one example, one basis function is roughly equal to I*M(I), and another basis function is roughly equal to I*M(I)*M(I), where "I" represents the input signal (e.g., baseband communication signal 14) and "M(I)" represents the magnitude of the input signal. Nonlinear predistorter 60 desirably equalizes the basis functions through independent adaptive equalizers (not shown), then combines and delays the equalized basis functions to form a nonlinear predistorted signal 66. Nonlinear predistorted signal 66 is applied to a first input of a combiner 68.

The adaptive equalizers in nonlinear predistorter 60 desirably adapt equalizer coefficients in response to LMS-based, estimation-and-convergence algorithms. In other words, the adaptive equalizers desirably estimate equalizer coefficient values that will influence the amount of a form of nonlinear distortion in a form of communication signal 14 broadcast from transmitting unit 12, and then alter the coefficients over time in accordance with an LMS algorithm to achieve decreasing amounts of nonlinear distortion until convergence is reached at a minimum amount of nonlinear distortion. The estimation-and-convergence algorithms are based upon feedback obtained downstream of RF power amplifier 22.

Those skilled in the art will appreciate that the above-discussed equalizer-based nonlinear predistorter 60 is not the only type of nonlinear predistorter that may be satisfactorily used in transmitting unit 12. For example, an alternate embodiment may use a table-based implementation.

A form of baseband communication signal 14, such as notched signal 28, also drives a linear predistorter 62, where it is spectrally processed to introduce in-band predistortion other than IB distortion 40 (FIG. 6). Linear predistorter 62 is included to counteract in-band distortion introduced into communication signal 14 downstream in analog components. In one embodiment, linear predistorter 62 uses an adaptive equalizer to apply a linear predistortion transformation function to communication signal 14. As with the above-discussed embodiment of nonlinear predistorter 60, linear predistorter 62 desirably adjusts equalizer coefficients in response to an LMS based estimation-and-convergence algorithm. The adaptive equalizer of linear predistorter 62 desirably estimates equalizer coefficient values that will influence the amount of linear distortion in a form of communication signal 14 broadcast from transmitting unit 12, then alters these coefficients over time to adjust the predistortion transformation function applied by the adaptive equalizer and to achieve decreasing amounts of linear distortion until convergence is reached at a minimum amount of linear distortion. After linear distortion in linear predistorter 62, communication signal 14, in the form of a linear predistorted signal 72 is routed to a second input of combiner 68, where nonlinear predistorted signal 66 is added into it.

An output of combiner 68 couples to an input of a digital-to-analog (D/A) converter 74. All signals within transmitting unit 12 upstream of D/A converter 74 are digital signals. Consequently, within the limits of sampling rate and quantization they are not influenced by noise, drift, offsets, inaccuracies, and other undesirable characteristics of analog processing. But in D/A converter 74, communication signal 14 is converted into an analog signal which will be subjected to such undesirable characteristics in downstream components. An output of D/A converter 74 provides an analog, baseband, peak-reduced, notched, predistorted version of communication signal 14 to an upconverter 76.

FIG. 7 graphically shows signals depicted in FIG. 6 at baseband, but now shifted to RF frequencies by upconverter 76. Upconverter 76 is configured to frequency shift the analog, baseband form of communication signal 14 to an RF band of frequencies. In particular bandwidth 24 is frequency shifted to an RF bandwidth 78 that has been assigned to transmitting unit 12. Likewise, IB distortion 40 has been frequency shifted into RF bandwidth 78, OOB distortion 38 has been frequency shifted to an RF spectral location outside of RF bandwidth 78, upper and lower rejection bands 48 and 50 have been respectively frequency shifted to upper and lower RF rejection bands 80 and 82, and upper and lower spectral notches 56 and 58 have been frequency shifted into RF rejection bands 80 and 82. An output of upconverter 76 provides an analog, RF, peak-reduced, notched, predistorted version of communication signal 14 referred to simply as RF signal 84 below. RF signal 84 has signal components both within RF bandwidth 78 and outside of RF bandwidth 78. The components outside of RF bandwidth 78 result from OOB distortion 38 and from distortion added by nonlinear predistorter 60. FIG. 7 also shows spectral mask 30 translated to its RF location. As with the baseband form of communication signal 14, the ratio of RF signal 84 within RF bandwidth 78 to RF signal 84 outside of RF bandwidth 78 still violates spectral mask 30 under which transmitting unit 12 operates.

Referring back to FIG. 2, RF signal 84 is provided to a bandpass filter 86 that removes an unwanted upconversion-induced sideband, then RF signal 84 passes to RF power amplifier 22. As discussed above, RF power amplifier 22 is desirably configured as a linear amplifier. And, in order to save costs and improve efficiency, RF power amplifier 22 need not exhibit a linear range of operation that accommodates an unusually large PAPR. In the preferred embodiment, PAPR has been reduced in RF signal 84 to accommodate the capabilities of RF power amplifier 22, and the linear range of operation of RF power amplifier 22 has been extended through the use of nonlinear predistorter 60. But nothing prevents the use of an RF power amplifier 22 that does exhibit an unusually large PAPR. RF power amplifier 22 amplifies RF signal 84 to produce an amplified, analog, RF, peak-reduced, notched, version of communication signal 14, referred to below simply as amplified RF signal 88. Desirably, predistortion introduced into communication signal 14 by nonlinear predistorter 60 has been canceled by RF power amplifier 22 distorting communication 14 in a manner opposite to the predistortion.

Amplified RF signal 88 is provided in two versions within the preferred embodiment of transmitting unit 12. A first version is provided directly from RF power amplifier 22 to an isolating section 90, which may be implemented using a circulator or the like. Isolating section 90 prevents reflected energy from a downstream-located bandpass filter or antenna from propagating back upstream toward RF power amplifier 22. A second version of amplified RF signal 88 is provided at the output port of isolating section 90. This second version is supplied to a bandpass filter 92, where its spectral characteristics are altered by substantially attenuating OOB distortion 38 sufficiently so that the resulting version of communication signal 14 complies with spectral mask 30. An output of BPF 92 couples to an antenna 94 from which communication signal 14 is broadcast.

First and second directional couplers 96 and 98 respectively couple small portions of the first and second versions of amplified RF signal 88 to input ports of a switching device 100. An output of switching device 100 provides a feedback signal 102 that drives an input of feedback processor 64. Switching device 100 is operated to switch back and forth between its input ports to alternately select the first version of amplified RF signal 88, which has not been altered by BPF 92, and the second version of amplified RF signal 88, which has been altered by BPF 92. The selected version of amplified RF signal 88 is routed upstream to feedback processor 64 where it is processed into a useful form for closing a feedback loop which adapts coefficients in predistorters 60 and 62.

Feedback processor 64 may include an analog-to-digital converter where feedback signal 102 is converted into a digital form. Desirably, such an analog-to-digital converter samples coherently with the local oscillator (not shown) used by upconverter 76. In a preferred embodiment, the sampling rate is controlled to achieve a digital, subharmonic, sampling downconversion of feedback signal 102 into a baseband form. This digital baseband form of feedback signal 102 is supplied to a Hilbert transform and then to a phase alignment section. Feedback processor 64 also receives a baseband form of the forward propagating communication signal 14, such as notched signal 28. This signal is delayed into time alignment with the phase-aligned form of feedback signal 102, and one signal is subtracted from the other to form a feedback error signal 104.

Essentially, the baseband form of the forward propagating communication signal 14 input to feedback processor 64 represents a baseband version of the ideal signal RF power amplifier 22 should reproduce, and feedback error signal 104 conveys the distortion introduced downstream of this forward propagating communication signal 14 within transmitting unit 12 and included in amplified RF signal 88. Feedback error signal 104 drives inputs of linear predistorter 62 and nonlinear predistorter 60. It is error signal 104 that drives adaptation loops within predistorters 62 and 60 to minimize linear and nonlinear distortion. Linear and nonlinear predistorters 62 and 60 adapt equalizer coefficients in a way that minimizes the distortion indicated by feedback error signal 104.

BPF 92 is configured to attenuate distortion outside of RF bandwidth 78 (FIG. 7). Since the first version of amplified RF signal 88 is not influenced by the operation of BPF 92, it conveys nonlinear distortion. It is this first version of amplified RF signal 88 that is used at switching device 100 in adapting equalizer coefficients for nonlinear predistorter 60. The second version of amplified RF signal 88 is influenced by the operation of BPF 92. In particular, it experiences linear distortion injected into communication signal 14 by BPF 92. It is this second version of amplified RF signal 88 that is used at switching device 100 in adapting equalizer coefficients for linear predistorter 62.

FIG. 8 shows a block diagram of one embodiment of BPF 92. In this embodiment, communications signal 14, in the form of the second version of amplified RF signal 88 is supplied to input ports of a fast rolloff filter 106 and a slow rolloff filter 108. An output port of fast-rolloff filter 106 couples to ground through an appropriate load (not shown). An output port of slow-rolloff filter 108 couples to antenna 94 (FIG. 2).

Figure 9:
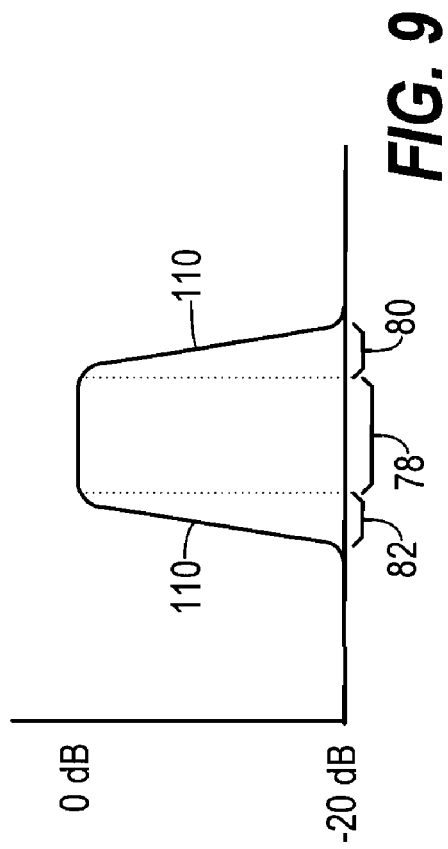
FIG. 9 graphically shows a response curve exhibited by the exemplary bandpass filter of FIG. 8.

FIG. 9 graphically shows a response curve exhibited by bandpass filter 92. The response curve of FIG. 9 is due primarily to the configuration of fast rolloff filter 106. Fast rolloff filter 106 is desirably configured as a multi-band filter in which a low-pass filter (LPF) and a high-pass filter (HPF) are combined together to achieve the response curve depicted in FIG. 9. The HPF portion of filter 106 desirably has a corner frequency at or near the lower boundary of RF bandwidth 78, causing all frequencies lower than this corner frequency to be attenuated by being shunted to ground. The LPF portion of filter 106 desirably has a corner frequency at or near the upper boundary of RF bandwidth 78, causing all frequencies higher than this corner frequency to be attenuated by being shunted to ground. Desirably filter 106 exhibits a passband approximately equal to RF bandwidth 78, and introduces little insertion loss.

Filter 106 has rolloff regions 110 corresponding to upper and lower RF rejection bands 80 and 82, where the response curve tapers from a low insertion loss response near RF bandwidth 78 to a significant amount of attenuation at the outer boundaries of upper and lower RF rejection bands 80 and 82. In other words, rolloff regions 110 rolloff throughout RF rejection bands 80 and 82. This amount of attenuation is sufficient to bring OOB distortion 38 immediately outside the outer boundaries of upper and lower RF rejection bands 80 and 82 below spectral mask 30 (FIG. 7). In the preferred embodiment, signal components of amplified RF signal 88 are attenuated at a rolloff rate of greater than 20 dB per octave throughout rolloff regions 110, and preferably at a rolloff rate of about 30 dB per octave. This fast rolloff characteristic of filter 106 allows upper and lower RF rejection bands 80 and 82 to be narrow, thereby permitting an effective amount of the out-of-band energy from threshold-responsive signal 36 (FIG. 3) to be used in peak reduction. This effective amount of out-of-band energy allows a smaller proportion of in-band energy from threshold-responsive signal 36 to be used in peak reduction, improving EVM in communication signal 14 broadcast from antenna 94. It also reduces the interference of peak reduction applied for one peak event with peak reduction applied to a nearby peak in the time domain, making peak reduction results more effective and further improving EVM.

In one embodiment, fast rolloff filter 106 may be implemented using a film bulk acoustic resonator (FBAR). Since filter 106 shunts primarily out-of-band signal components to ground, fast rolloff filter 106 need not be configured to dissipate a large amount of power.

Slow rolloff filter 108 may exhibit a slower rolloff than fast rolloff filter 106. The performance of filter 108 combines with the performance of filter 106, but due to its slower rolloff characteristics it may exert little influence on the combined performance. In one embodiment, slow rolloff filter 108 may be implemented in a duplexer. Linear distortion introduced into amplified RF signal 88 by BPF 86 may be compensated for through linear predistorter 62 since its feedback signal is extracted downstream of BPF 86.

Figure 10:
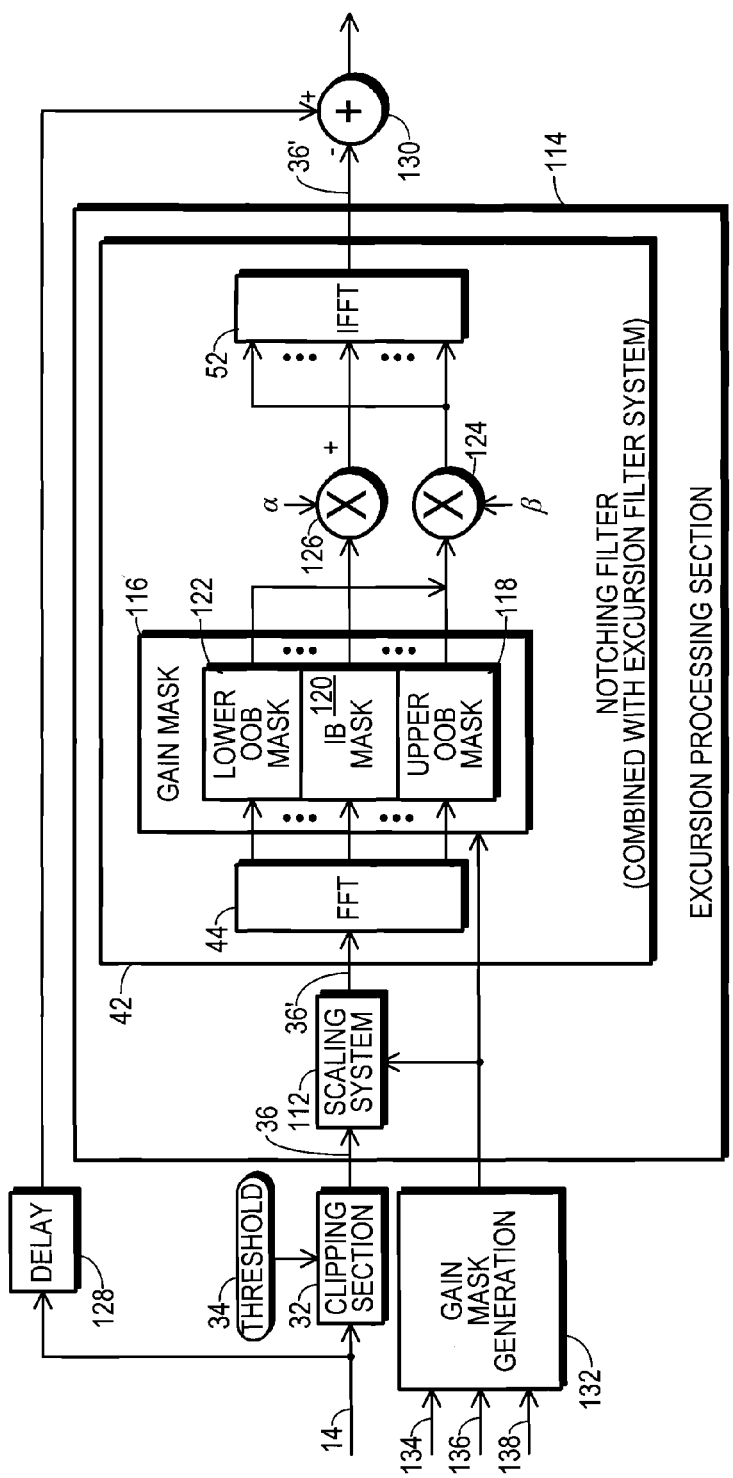
FIG. 10 shows a block diagram of a second embodiment of a peak-to-average power ratio (PAPR) reduction section of the exemplary transmitting unit of FIG. 2.

FIG. 10 shows a block diagram of a second embodiment of PAPR reduction section 26. The first embodiment was discussed above in connection with FIG. 3. While the FIG. 3 embodiment is adequate for some applications, this FIG. 10 embodiment achieves greater PAPR reduction at a lower EVM expense, particularly when communication signal 14 concurrently conveys a plurality of channels intended to be received by a plurality of receiving units 16 (FIG. 1).

In this embodiment of PAPR reduction section 26, the weakly processed version of communication signal 14 formed by modulator 20 (FIG. 2) is applied at clipping section 32. Clipping section 32 forms threshold-responsive signal 36 by performing a function nearly opposite to that performed by clipping section 32 in the FIG. 3 embodiment. Here, clipping section 32 substitutes zero magnitude samples for all samples in communication signal 14 that are less than threshold 34, and passes all samples having a magnitude greater than or equal to threshold 34, but reduced in magnitude by the magnitude of threshold 34. Thus, the threshold-responsive signal 36 generated in clipping section 32 conveys the portion of communication signal 14 that exceeds threshold 34. In other words, in this embodiment threshold-responsive signal 36 is an excursion signal which conveys the excursion portion of communication signal 14 clipped from communication signal 14 in clipping section 32. Thus, threshold-responsive signal 36 is referred to below as excursion signal 36'.

In this embodiment, OOB distortion 38 and IB distortion 40, depicted by the dashed line in FIG. 4, together represent a frequency domain characterization of excursion signal 36'. Desirably, the sampling rate at which excursion signal 36' is conveyed is sufficient to accurately convey much of OOB distortion 38 as well as IB distortion 40. Communication signal 14 is not combined into excursion signal 36'. But if excursion signal 36' were combined out-of-phase with communication signal 14, it would cancel the peak events in communication signal 14, and the resulting combined signal would violate spectral mask 30 (FIG. 4). Excursion signal 36' is further processed within PAPR reduction section 26 and eventually recombined with communication signal 14 to cancel the peaks.

Excursion signal 36' is a time domain signal that passes to a scaling system 112 of an excursion processing section 114. A scaled version of excursion signal 36' then passes from scaling system 112 to notching filter 42. In general, scaling system 112 scales excursion signal 36' and notching filter 42 then filters excursion signal 36'. Notching filter 42 includes FFT section 44, driven by a scaled version of excursion signal 36'. FFT section 44 transforms the time domain scaled excursion signal 36' into a frequency domain signal. FFT section 44 desirably spans the frequency range covered by OOB distortion 38 and IB distortion 40.

A gain mask 116 is applied to the frequency bins formed by FFT section 44. FIG. 10 indicates three separate sections for gain mask 116. A section 118 is for OOB distortion 38 above bandwidth 24 (FIG. 4), a section 120 is for IB distortion 40, which is located within bandwidth 24, and a section 122 is for OOB distortion 38 below bandwidth 24. Gain mask 116 defines dot-product multiplicands to be used with each frequency bin. Here, the dot-product multiplicands need not be limited to binary values of one or zero, but may exhibit any value. Otherwise, gain mask 116 operates like binary switching masks 46' and 46" discussed above in connection with FIG. 5.

For instructional purposes, FIG. 10 depicts a scaling section 124 operating to scale the dot products output from OOB mask sections 118 and 122 by a scale factor designated as "$\beta$". And, a scaling section 126 operates to scale the dot products output from IB mask section 120 by a scale factor designated as "$\alpha$". But scaling sections 124 and 126 may alternatively be omitted because scaling factors $\alpha$ and $\beta$ can also be applied to the respective multiplicands of gain mask 116. Outputs from scaling sections 124 and 126, or preferably from gain mask 116 when scaling factors $\alpha$ and $\beta$ are incorporated in gain mask 116, drive IFFT section 52. IFFT section 52 transforms the now filtered excursion signal 36' into a time domain signal. The version of excursion signal 36' produced by IFFT section 52 serves as the output of notching filter 42 and of excursion processing section 114.

The communication signal 14 applied to clipping section 32 is also delayed in a delay element 128 and passed to an input of a combining section 130. The notched version of excursion signal 36' generated by notching filter 42 is recombined with communication signal 14 at combining section 130. In the preferred embodiment, the combination which takes place at combining section 130 adds this notched version of excursion signal 36' out-of-phase with communication signal 14 so that a subtraction operation results. Delay element 58 is configured to temporally align communication signal 14 with this notched version of excursion signal 36', which has been delayed relative to the version of communication signal 14 supplied to PAPR reduction section 26 by the operation of clipping section 32 and excursion processing section 114. As a result of the operation of combining section 130, those peaks in communication signal 14 that exceed threshold 34 are cancelled. But the portion of OOB distortion 38 that passes through gain mask 116 is also combined during the combination operation of combining section 130. The resulting version of communication signal 14 output by combining section 130 is a peak-reduced, notched version of communication signal 14 that violates spectral mask 30.

Figure 11:
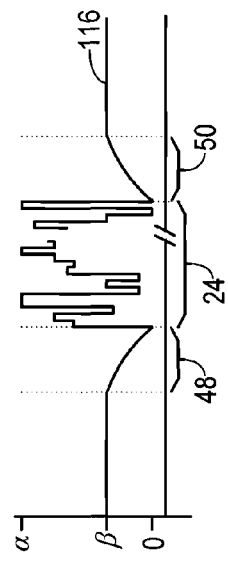
FIG. 11 graphically shows an exemplary gain mask used in connection with a notching filter portion of the PAPR reduction section of FIG. 10.

FIG. 11 graphically shows an exemplary gain mask 116 which may be used in connection with notching filter 42. As discussed above in connection with FIGS. 5-6, notching filter 42 implements upper and lower rejection bands 48 and 50. In this embodiment, a minimum gain value (e.g., zero) is used immediately adjacent to bandwidth 24, with increasing gain values provided as the frequency bins of rejection bands 48 and 50 extend away from bandwidth 24. The precise gain slope and shape within rejection bands 48 and 50 is desirably configured to complement rolloff regions 110 (FIG. 9) of BPF 92 (FIG. 2) so that communication signal 14 broadcast from transmitting unit 12 has spectral characteristics closely matched to spectral mask 30. By closely matching spectral mask 30, transmitting unit 10 meets regulatory requirements, and as much OOB distortion 38 as possible is used in reducing PAPR. This permits proportionally less IB distortion 40 to be used for PAPR reduction, which reduces EVM, which in turn allows more PAPR reduction to take place until transmitting unit 12 operates at the EVM specification.

The exemplary gain mask 116 depicted in FIG. 11 is one which might be used in an OFDM application. Within bandwidth 24, FIG. 11 depicts different gain values being applied to each subcarrier. In OFDM applications, for any given symbol period transmitting unit 12 may transmit a number of different channel types, where each channel type corresponds to a distinct modulation order and convolutional coding rate. Each channel type has its own EVM specification. Thus, within bandwidth 24 gain mask 116 allows more IB distortion 40 in those subcarriers that are associated with channel types permitting more EVM, and allows less IB distortion 40 in those subcarriers that are associated with channel types permitting less EVM. Through IB mask section 120 of gain mask 116, notching filter 42 implements an excursion filtering system directed to IB distortion 40. It is through upper and lower OOB mask sections 118 and 122 of gain mask 116 that notching filter 42 implements upper and lower spectral notches 56 and 58 (FIGS. 6-7).

FIG. 11 also depicts the application of the above-discussed $\alpha$ and $\beta$ scale factors. In particular, a maximum gain value outside of bandwidth 24, which is applied to OOB distortion 38, is set at the $\beta$ scale factor; and, a maximum gain value inside bandwidth 24, which is applied to IB distortion 40, is set at the $\alpha$ scale factor. By controlling the $\alpha$ and $\beta$ scale factors, notching filter 42 is configured to scale IB distortion 40 relative to OOB distortion 38 so that after combining notched signal 36' with communication signal 14 in combining section 130, peaks in communication signal 14 are reduced substantially to threshold 34 and IB distortion 40 within bandwidth 24 is minimized. The $\alpha$ and $\beta$ scale factors need not vary during the operation of transmitting unit 12. In the preferred embodiment, $\alpha$ and $\beta$ are determined empirically to match the characteristics of BPF 92 and the particulars of the communication standard under which transmitting unit 12 is operating.

Referring to FIGS. 10 and 11, a gain mask generation section 132 is responsible for providing and updating gain masks 116. Gain mask generation section 132 forms gain masks 116 in response to data 134 describing residual noise, data 136 corresponding to EVM specifications for different channel types that transmitting unit 12 may transmit, and data 138 describing the current mix of channel types for the symbol period being processed. Residual noise data 134 may be obtained from feedback error signal 104. IB mask section 120 is configured to cause notching filter 42 to pass as much IB distortion 40 as possible without violating an EVM specification for any channel type being transmitted, given a current level of residual noise that downstream components are introducing into communication signal 14.

But notching filter 42 passes different amounts of IB distortion 40 in different symbol periods depending upon the mix of channel types being transmitted. Consequently, the amount of insertion loss notching filter 42 inflicts on excursion signal 36' varies. This variance in insertion loss is compensated for by scaling system 112. Thus, data responsive to gain mask 116 is also used to scale excursion signal 36' in scaling system 112. In particular, excursion signal 36' is scaled in scaling system 112 by an amount which is responsive to the current channel type mix for the symbol period being processed. When more higher-modulation-order channel types are present, gain mask 116 applies lower gain in IB mask section 120, and scaling system 112 scales excursion signal 36' to a greater degree. Conversely, when more lower-modulation-order channel types are present, gain mask 116 applies higher gain in IB mask section 120, and scaling system 112 scales excursion signal 36' to a lesser degree.

In one alternate embodiment which may be more suitable for an OFDMA application, IB mask section 120 is likely to apply the same gain values to all active subcarriers and zeros to all inactive subcarriers because only a single channel type is transmitted at any single instant. In this application, scaling system 112 may be omitted, and the $\alpha$ and $\beta$ scale factors may simply be selected from a table (not shown) in response to identification of the current channel type.

In another alternate embodiment notching filter 42 may be implemented in the time domain using digital filtering techniques known to those skilled in the art, permitting FFT and IFFT sections 44 and 52 to be omitted.

In summary, at least one embodiment of the present invention provides a transmitting unit that achieves greater amounts of PAPR reduction while meeting EVM specifications. In accordance with at least one embodiment of the present invention, a transmitting unit uses significant quantities of both in-band and out-of-band distortion generated in a clipping operation to reduce PAPR. In accordance with at least one embodiment of the present invention, a notching filter is configured to notch out only a portion of the out-of-band distortion adjacent to the communication signal's bandwidth, but to let other portions of the out-of-band distortion and in-band distortion pass with the communication signal through an RF power amplifier, where it is then filtered off to achieve compliance with a spectral mask.

Although the preferred embodiments of the invention have been illustrated and described in detail, it will be readily apparent to those skilled in the art that various modifications and adaptations may be made without departing from the spirit of the invention or from the scope of the appended claims. For example, those skilled in the art will appreciate that the specific functions depicted herein through the use of block diagrams may be partitioned in equivalent but different ways than shown and discussed herein. Such equivalent but different ways and the modifications and adaptations which may be implemented to achieve them are to be included within the scope of the present invention.

What is claimed is:

1. A transmitting unit which reduces peak to average power ratio (PAPR) for a communication signal, said transmitting unit comprising:
    a modulator configured to form a communication signal having signal components confined within a bandwidth;
    a clipping section coupled to said modulator, said clipping section being configured to generate a threshold-responsive signal having distortion within said bandwidth and outside said bandwidth;
    a notching filter coupled to said clipping section, said notching filter being configured to notch a frequency spectrum of said threshold-responsive signal to generate a notched signal, wherein said frequency spectrum is notched adjacent to said bandwidth;
    an upconverter coupled to said notching filter, said upconverter being configured to frequency shift said notched signal into an RF signal in which said bandwidth has been frequency shifted to an RF bandwidth, said distortion within said bandwidth has been frequency shifted to said RF bandwidth, and said distortion outside said bandwidth has been frequency shifted outside said RF bandwidth;
    an RF amplifier coupled to said upconverter and configured to form an amplified RF signal from said RF signal; and a bandpass filter coupled to said RF amplifier and configured to filter said amplified RF signal to attenuate said distortion outside said RF bandwidth.

2. A transmitting unit as claimed in claim 1 wherein said notching filter is configured so that said notched signal includes a first spectral notch adjacent to and above said bandwidth and a second spectral notch adjacent to and below said bandwidth.

3. A transmitting unit as claimed in claim 1 wherein said clipping section is configured so that said threshold-responsive signal is a peak-reduced communication signal.

4. A transmitting unit as claimed in claim 1 wherein:
said clipping section is configured so that said threshold-responsive signal is an excursion signal; and
said transmitting unit additionally comprises a combining section coupled to said modulator and to said notching filter.

5. A transmitting unit as claimed in claim 4 wherein:
said clipping section is configured so that said excursion signal is responsive to a threshold;
said notching filter is included in an excursion processing section; and
said excursion processing section is configured to scale said distortion within said bandwidth relative to said distortion outside of said bandwidth so that after combining said notched signal with said communication signal in said combining section, peaks in said communication signal are reduced substantially to said threshold and said distortion within said bandwidth is minimized.

6. A transmitting unit as claimed in claim 1 wherein:
said RF signal has signal components within said RF bandwidth and outside said RF bandwidth; and
a ratio of said RF signal within said RF bandwidth to said RF signal outside said RF bandwidth violates a spectral power mask under which said transmitting unit operates.

7. A transmitting unit as claimed in claim 1 wherein said bandpass filter is configured to exhibit a rolloff rate of greater than 20 dB per octave.

8. A transmitting unit as claimed in claim 7 wherein said bandpass filter is formed using a film bulk acoustic resonator (FBAR).

9. A transmitting unit as claimed in claim 1 wherein:
said notching filter implements a rejection band;
said rejection band is shifted to an RF rejection band by said upconverter; and
said bandpass filter is configured to rolloff throughout said RF rejection band.

10. A transmitting unit as claimed in claim 9 wherein:
said rejection band is a first rejection band located adjacent to and below said bandwidth;
said notching filter also implements a second rejection band located adjacent to and above said bandwidth;
said first and second rejection bands are respectively shifted to first and second RF rejection bands by said upconverter; and
said bandpass filter is configured to rolloff throughout each of said first and second RF rejection bands.

11. A transmitting unit as claimed in claim 9 wherein said rejection band extends across a narrower range of frequencies than said bandwidth.

12. A transmitting unit as claimed in claim 1 additionally comprising:
a predistorter coupled between said notching filter and said upconverter; and
an isolating section coupled between said RF amplifier and said bandpass filter, wherein a portion of said amplified RF signal upstream of said isolating section is feed back to said predistorter for use in configuring predistortion of said notched signal.

13. A method of operating a transmitting unit to reduce peak to average power ratio (PAPR) comprising:
forming a communication signal having signal components confined within a bandwidth;
generating, in response to said communication signal, a threshold-responsive signal having distortion within said bandwidth and outside said bandwidth;
notching a frequency spectrum of said threshold-responsive signal to generate a notched signal, wherein said frequency spectrum is notched adjacent to said bandwidth;
upconverting said notched signal to form an RF signal in which said bandwidth has been frequency shifted to an RF bandwidth, said distortion within said bandwidth has been frequency shifted to said RF bandwidth, and said distortion outside said bandwidth has been frequency shifted outside said RF bandwidth;
amplifying said RF signal to form an amplified RF signal; and
filtering said amplified RF signal to attenuate said distortion outside said RF bandwidth.

14. A method as claimed in claim 13 wherein said notched signal includes a first spectral notch adjacent to and above said bandwidth and a second spectral notch adjacent to and below said bandwidth.

15. A method as claimed in claim 13 wherein said threshold-responsive signal is a peak-reduced communication signal.

16. A method as claimed in claim 13 wherein:
said threshold-responsive signal is an excursion signal; and
said method additionally comprises combining said notched signal with said communication signal prior to said amplifying activity.

17. A method as claimed in claim 16 wherein:
said threshold-responsive signal is formed in response to a threshold; and
said method additionally comprises scaling said distortion within said bandwidth relative to said distortion outside of said bandwidth so that after combining said notched signal with said communication signal, peaks in said communication signal are reduced substantially to said threshold and said distortion within said bandwidth is minimized.

18. A method as claimed in claim 13 wherein:
said amplified RF signal has signal components within said RF bandwidth and outside said RF bandwidth; and
a ratio of said amplified RF signal within said RF bandwidth to said amplified RF signal outside said RF bandwidth violates a spectral power mask under which said transmitting unit operates.

19. A method as claimed in claim 13 wherein said amplified RF signal is filtered so that signal components outside said RF bandwidth are attenuated at a rolloff rate of greater than 20 dB per octave.

20. A method as claimed in claim 13 wherein:
said notched signal exhibits a rejection band over which said notched signal is notched;
said rejection band is shifted to an RF rejection band by said upconverting activity; and
said amplified RF signal is filtered to rolloff throughout said RF rejection band.

21. A method as claimed in claim 13 wherein said communication signal, said threshold-responsive signal, and said notched signal are digital signals, and said method additionally comprises:
converting said notched signal to an analog signal prior to said upconverting activity.

22. A method as claimed in claim 13 wherein said RF signal is amplitude modulated.

23. A method as claimed in claim 13 additionally comprising:
predistorting said notched signal in a predistorter to extend a range of linear operation for an RF amplifier that forms said amplified RF signal;
isolating a first version of said amplified RF signal from a second version of said amplified RF signal, said second version of said amplified RF signal being filtered to attenuate said distortion outside said RF bandwidth; and
feeding back a portion of said first version of said amplified RF signal to said predistorter for use in configuring predistortion of said notched signal.

24. A method as claimed in claim 23 wherein said predistorter is a nonlinear predistorter, and said method additionally comprises:
predistorting said notched signal in a linear predistorter to reduce linear distortion in said second version of said amplified RF signal; and
feeding back a portion of said second version of said amplified RF signal to said linear predistorter for use in configuring linear predistortion of said notched signal.

25. A transmitting unit which reduces peak to average power ratio (PAPR) for a communication signal, said transmitting unit comprising:
a modulator configured to form a communication signal having signal components confined within a bandwidth;
a clipping section coupled to said modulator, said clipping section being configured to generate an excursion signal having distortion within said bandwidth and outside said bandwidth;
a notching filter coupled to said clipping section, said notching filter being configured to notch a frequency spectrum of said excursion signal to generate a notched signal, wherein said frequency spectrum includes a first spectral notch adjacent to and above said bandwidth and a second spectral notch adjacent to and below said bandwidth
a combining section coupled to said modulator and to said notching filter for combining said notched signal into said communication signal to produce a peak-reduced communication signal;
an upconverter coupled to said combining section, said upconverter being configured to frequency shift said peak-reduced communication signal to form an RF signal in which said bandwidth has been frequency shifted to an RF bandwidth, said distortion within said bandwidth has been frequency shifted to said RF bandwidth, and said distortion outside said bandwidth has been frequency shifted outside said RF bandwidth;
an RF amplifier coupled to said upconverter and configured to form an amplified RF signal from said RF signal; and
a bandpass filter coupled to said RF amplifier and configured to filter said amplified RF signal to attenuate said distortion outside said RF bandwidth.

26. A transmitting unit as claimed in claim 25 wherein:
said clipping section is configured so that said excursion signal is responsive to a threshold; and
said notching filter is further configured to scale said distortion within said bandwidth relative to said distortion outside of said bandwidth so that after combining said notched signal with said communication signal in said combining section, peaks in said communication signal are reduced substantially to said threshold and said distortion within said bandwidth is minimized.

27. A transmitting unit as claimed in claim 25 wherein:
said peak-reduced communication signal has signal components within said bandwidth and outside said bandwidth; and
a ratio of said peak-reduced communication signal within said RF bandwidth to said peak-reduced communication signal outside said RF bandwidth violates a spectral power mask under which said transmitting unit operates.

* * * * *